(12) United States Patent
Yaacobi-Gross

(10) Patent No.: US 11,075,341 B2
(45) Date of Patent: Jul. 27, 2021

(54) ORGANIC MICROCAVITY PHOTODETECTORS WITH NARROW AND TUNABLE SPECTRAL RESPONSE

(71) Applicants: Cambridge Display Technology Limited, Godmanchester (GB); Sumitomo Chemical Company Limited, Tokyo (JP)

(72) Inventor: Nir Yaacobi-Gross, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 90 days.

(21) Appl. No.: 16/337,329

(22) PCT Filed: Sep. 7, 2017

(86) PCT No.: PCT/GB2017/052605
§ 371 (c)(1),
(2) Date: Mar. 27, 2019

(87) PCT Pub. No.: WO2018/060672
PCT Pub. Date: Apr. 5, 2018

(65) Prior Publication Data
US 2020/0227642 A1    Jul. 16, 2020

(30) Foreign Application Priority Data
Sep. 27, 2016   (GB) .................................... 1616347

(51) Int. Cl.
*H01L 51/00* (2006.01)
*H01L 31/0232* (2014.01)
(Continued)

(52) U.S. Cl.
CPC ........ *H01L 51/0036* (2013.01); *H01L 27/307* (2013.01); *H01L 51/0039* (2013.01);
(Continued)

(58) Field of Classification Search
CPC ............... H01L 27/307; H01L 51/0036; H01L 51/0039; H01L 51/0046; H01L 51/442; H01L 2251/308
See application file for complete search history.

(56) References Cited

U.S. PATENT DOCUMENTS 9,508,945 B2 * 11/2016 Holmes ............... H01L 51/4246
2018/0108846 A1 *  4/2018 Lunt, III ............... H01L 51/006

OTHER PUBLICATIONS

International Search Report and Written Opinion for International Application No. PCT/GB2017/052605, dated Dec. 8, 2017.
(Continued)

*Primary Examiner* — Alonzo Chambliss
(74) *Attorney, Agent, or Firm* — Wolf, Greenfield & Sacks, P.C.

(57) ABSTRACT

An organic photodetector (OPD) comprises a microcavity defined by a reflective electrode and a semi-transparent electrode, wherein the microcavity comprises a transparent conductive oxide layer and an active layer comprising an n-type organic semiconductor and a p-type organic semiconductor, and wherein the blend of the n-type organic semiconductor and the p-type organic semiconductor exhibits low absorption at the resonance wavelength, which results in an excellent optical sensitivity in a favorably narrow wavelength region and allows to tune the response to different wavelengths depending on the desired application. In addition, methods of producing such organic photodetectors and methods of tuning the resonance of a microcavity formed in an organic photodetector (OPD) to a predetermined wavelength are provided.

18 Claims, 2 Drawing Sheets

(51) Int. Cl.
    *H01L 31/0203*    (2014.01)
    *H01L 51/40*      (2006.01)
    *H01L 27/30*      (2006.01)
    *H01L 51/44*      (2006.01)
(52) U.S. Cl.
    CPC ........ *H01L 51/0046* (2013.01); *H01L 51/442* (2013.01); *H01L 2251/308* (2013.01)

(56) References Cited

OTHER PUBLICATIONS

Combined Search and Examination Report for British Application No. GB1616347.9, dated Feb. 22, 2017.

An et al., Organic photodetector with spectral response tunable across the visible spectrum by means of internal optical microcavity. Organic Electronics. 2009;10(6):1152-7.

Jahnel et al., Integration of near infrared and visible organic photodiodes on a complementary metal-oxide-semiconductor compatible backplane. Thin Solid Films. 2015;592:94-8.

Lupton et al., Organic Microcavity Photodiodes. Advanced Materials. 2003;15(17):1471-4.

\* cited by examiner

ORGANIC MICROCAVITY PHOTODETECTORS WITH NARROW AND TUNABLE SPECTRAL RESPONSE

RELATED APPLICATIONS

This Application is a national stage filing under 35 U.S.C. § 371 of international PCT application PCT/GB2017/052605, filed Sep. 7, 2017, which claims priority to United Kingdom patent application no. GB 1616347.9, filed Sep. 27, 2016, each of which is incorporated herein by reference in its entirety.

FIELD OF INVENTION

This invention relates to an organic photodetector (OPD) having excellent optical sensitivity in a favorably narrow wavelength region and allows to tune the response to different wavelengths depending on the desired application. In addition, methods of producing said organic photodetectors and methods of tuning the resonance of a microcavity formed in an organic photodetector (OPD) to a predetermined wavelength are disclosed.

BACKGROUND OF THE INVENTION

In the recent decade, there has been an increased interest into organic photodetectors as thin film alternatives to inorganic photosensors, particularly since they allow cost-effective processing in solution and at low temperatures and a fabrication of arbitrarily shaped, flexible and/or large-area devices.

Organic photodetectors are usually configured so as to comprise n- and p-type organic semiconductors sandwiched between two electrodes, optionally in combination with auxiliary layers, such as e.g. hole and electron extraction layers.

A growing number of imaging applications require color-selective detection, which is, however, challenging in view of the fact that many organic semiconductors tend to exhibit broad optical absorption.

In general, the detection selectivity of organic photodetectors is evaluated by means of the full width-half maximum (FWHM) in the spectral response, i.e. the external quantum efficiency (EQE) spectrum. As it has been shown by R. Jansen van Vuuren et al., Applied Physics Letters 2010, 96, 253303, detectors with a FWHM of 100 nm or less provide for the necessary color discrimination required for use in machine vision systems, for example.

One strategy proposed to allow for color discrimination is the use of optical filters, such as notch filters. However, the implementation of optical filters requires additional processing steps and often involves limitations with respect to the possible device geometries and device integration, so that finding alternatives is desirable.

In the recent years, it has been shown that placing a photodiode inside a wavelength scale microcavity effectively quantizes the light field to allow for spectral narrowing and may hence represent a promising alternative to optical filters. For example, D. M. Lyons et al., Organic Electronics 2014, 15, 2903-2911, disclose a narrow band green organic photodetector having a FWHM of 80 nm centered around 525 nm and an external quantum efficiency of 15% at −1.0 V, which is achieved by placing between two electrodes a stack structure consisting of a $PC_{60}BM$ layer, an active layer consisting of a ketocyanine dye/$PC_{60}BM$ blend, and a MoOx electron-blocking layer. However, enabling tuning of the response to different wavelengths remains desirable.

In this respect, J. M. Lupton et al, Advanced Materials 2003, 15(17), 1471-1474, propose microcavity photodiodes which comprise a configuration, wherein a bilayer consisting of a spin-coated layer of the semiconducting polymer MeLPPP and a fullerene layer is provided on an indium tin oxide (ITO) covered dielectric mirror. Herein, it is further disclosed that the resonance of the microcavity may be tuned to specific wavelengths by varying the thickness of the MeLPPP polymer layer. However, the EQE performance of these devices still leaves room for improvement as adjusting the active layer thickness in order to shift the resonance wavelength to the desired region tend to negatively affect the device sensitivity and the transmission properties of the microcavity. Thus, it would be desirable to provide a method which enables shifting of the resonance wavelength without requiring changes of the optimum active layer thickness.

Overall, it therefore remains desirable to provide organic photodetectors which simultaneously exhibit excellent external quantum efficiency, wherein the wavelength selectivity is further improved (i.e. the FWHM is decreased) and which allow the spectral response to be tuned to different wavelengths depending on the desired application.

Furthermore, it would be desirable to provide methods for manufacturing organic photodetectors with favourably narrow and wavelength-tuned response in an easy and cost-effective manner.

SUMMARY OF THE INVENTION

The present invention solves these objects with the subject matter of the claims as defined herein. The advantages of the present invention will be further explained in detail in the section below and further advantages will become apparent to the skilled artisan upon consideration of the invention disclosure.

This invention describes organic photodetectors wherein an optical cavity is used to tune the response to a specific wavelength range of interest while suppressing the sensitivity outside the said wavelength range, in combination with an active layer made of materials with relatively low absorption at the cavity resonance wavelength in order to allow an exceptionally narrow spectral response and simultaneously high external quantum efficiency without requiring the use of optical filters.

Generally speaking, the present invention relates to an organic photodetector (OPD) comprising: a microcavity defined by a reflective electrode and a semi-transparent electrode, wherein the microcavity comprises a transparent conductive oxide layer and an active layer comprising an n-type organic semiconductor and a p-type organic semiconductor; and wherein the transmittance T of the active layer at the wavelength $\lambda_{max}$ is at least 50%, $\lambda_{max}$ being the wavelength of the maximum of the external quantum efficiency (EQE) spectrum of the organic photodetector (OPD) at a desired range measured according to ASTM E1021. The version of ASTM E1021 is E1021-15 published in 2015.

In a further aspect, the present invention relates to a method of manufacturing an organic photodetector (OPD) comprising: providing a transparent conductive oxide layer and an active layer between a first semi-transparent electrode which is reflective and a second semi-transparent electrode which define a microcavity, wherein the active layer comprises a blend of an n-type organic semiconductor and a p-type organic semiconductor; and wherein the n-type organic semiconductor and the p-type organic semiconductor are selected so that the absorption spectrum of the blend meets the above definition.

Another aspect of the present invention is a method of tuning the resonance of a microcavity formed in an organic photodetector (OPD) to a predetermined wavelength, the organic photodetector (OPD) comprising a microcavity between a first semi-transparent electrode and a second semi-transparent electrode which is reflective, and the microcavity comprising a transparent conductive oxide layer and an active layer comprising a blend of an n-type organic semiconductor and a p-type organic semiconductor; the method comprising a step of adjusting the thickness of the transparent conductive oxide layer in order to shift the resonance wavelength of the microcavity to the predetermined wavelength.

Preferred embodiments of the organic photodetector according to the present invention and other aspects of the present invention are described in the following description and the claims.

DETAILED DESCRIPTION OF THE INVENTION

Figure 1:
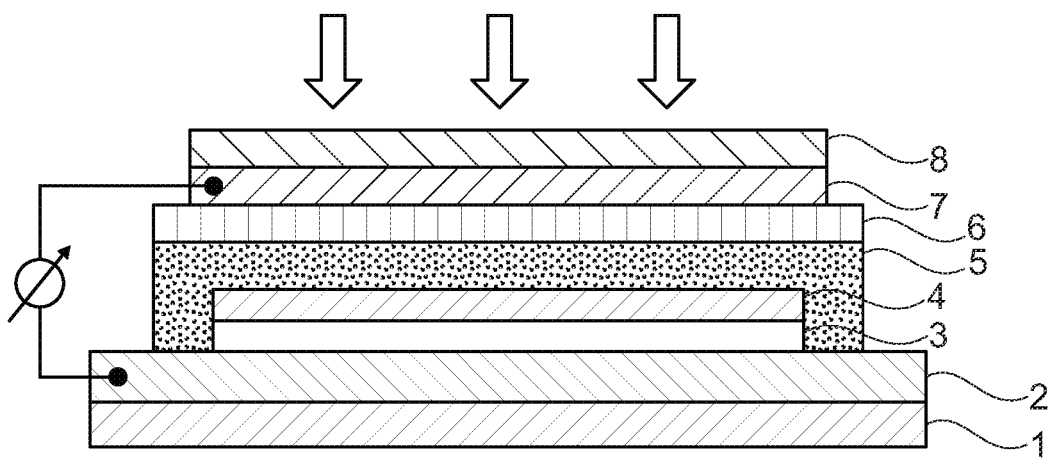
FIG. 1 schematically illustrates an exemplary configuration of an organic photodetector (OPD) according to the present invention.

For a more complete understanding of the present invention, reference is now made to the following description of the illustrative embodiments thereof:

In one embodiment, the present invention relates to an organic photodetector (OPD) comprising: a microcavity defined by a reflective electrode and a semi-transparent electrode, wherein the microcavity comprises a transparent conductive oxide layer and an active layer comprising a blend of an n-type organic semiconductor and a p-type organic semiconductor; and wherein the transmittance T of the active layer at a wavelength $\lambda_{max}$ is at least 50%, $\lambda_{max}$ being the wavelength of the maximum of the external quantum efficiency (EQE) spectrum of the organic photodetector (OPD) at a desired range measured according to ASTM E1021 (Standard Test Method for Spectral Responsivity Measurements).

The expression "maximum of the external quantum efficiency (EQE) spectrum", as used herein, corresponds to the (main) target resonance wavelength of the organic photodetector (OPD) and typically denotes the peak (i.e. the global maximum) of the EQE spectrum in the visible wavelength range.

The term "microcavity", as used herein, denotes an optical resonator, typically having a wavelength scale, the structure of which exhibits spectral selectivity due to resonant optical modes in the cavity between the reflective electrode and the semi-transparent electrode. Typically, the dimensions of the optical zone defining the microcavity along the direction of light propagation are on the order of at no more than a few (approximately four) wavelengths of the incident radiation.

Since the active layer comprising the blend of the n-type organic semiconductor and the p-type organic semiconductor exhibits a transmittance T at the wavelength $\lambda_{max}$ of at least 50%, preferably at least 60%, more preferably at least 70%, for example at least 80%, it is ensured that the active layer absorption at the main resonance wavelength of the microcavity is low, since the relationship between transmittance T and absorbance will be basically defined by the following equation according to the Beer-Lambert law, wherein k is the extinction coefficient (absorptivity coefficient) of the active layer, d is the thickness of the active layer, and $\lambda_{max}$ is the wavelength of the maximum of the external quantum efficiency (EQE) spectrum:

$$T = e^{-\frac{4\pi k d}{\lambda_{max}}}$$

The method of determination of the transmittance is not particularly limited and may involve spectrophotometric methods known in the art.

It has been surprisingly found that the use of an active layer having a high transmittance in the specified range enables a favourably narrow response, i.e. a small full width at half maximum (FWHM) in the external quantum efficiency spectrum of the organic photodetector. In a preferred embodiment, the organic photodetector of the present invention exhibits a (preferably global) EQE maximum within a wavelength range of between 400 to 700 nm, such as 460 to 600 nm, more preferably between 500 and 560 nm (cyan/green). In preferred embodiments, the organic photodetector may exhibit a FWHM in the EQE spectrum of less than 80 nm, more preferably less than 50 nm, which is a remarkable improvement over comparable prior art devices.

It is to be noted that the n-type organic semiconductor and a p-type organic semiconductor are comprised in the form of a blended layer, which remarkably simplifies the processing method when compared to the manufacture of a bi-layer structure comprising neat films of each the n-type organic semiconductor and the p-type organic semiconductor.

The n-type organic semiconductor is not particularly limited and may be suitably selected from electron accepting materials known to the skilled artisan in dependence of its absorption at the resonance wavelength in order for the blend to meet the above-defined criteria. As examples of n-type organic semiconductors fullerenes and fullerene derivatives may be mentioned. Preferably, the n-type organic semiconductor is selected from $C_{60}$, $C_{70}$, $C_{96}$, PCBM-type fullerene derivatives (including phenyl-C61-butyric acid methyl ester ($C_{60}$PCBM), TCBM-type fullerene derivatives (e.g. tolyl-C61-butyric acid methyl ester ($C_6$TCBM)), ThCBM-type fullerene derivatives (e.g. thienyl-C61-butyric acid methyl ester ($C_{60}$ThCBM). As further examples of fullerene derivatives, those disclosed in WO 2004/073082 A1, US 2011/0132439 A1, WO 2015/036075 A1, and US 2011/0132439 A1 may be mentioned. From the viewpoint of favourably low absorption in the visible region, the n-type organic semiconductor is preferably C60 fullerene derivative. It is understood that the n-type organic semiconductor may also consist of a mixture of a plurality of the above electron accepting materials.

The p-type organic semiconductor is likewise not particularly limited and may be appropriately selected from standard electron donating materials that are known to the person skilled in the art and are described in the literature. In a preferred embodiment the p-type organic semiconductor is an organic conjugated polymer, which can be a homopolymer or copolymer including alternating, random or block copolymers. Preferred are non-crystalline or semi-crystalline conjugated organic polymers. As exemplary p-type organic semiconducting polymers, polymers selected from conjugated hydrocarbon or heterocyclic polymers including polyacene, polyaniline, polyazulene, polybenzofuran, polyfluorene, polyfuran, polyindenofluorene, polyindole, polyphenylene, polypyrazoline, polypyrene, polypyridazine, polypyridine, polytriarylamine, poly(phenylene vinylene), poly(3-substituted thiophene), poly(3,4-bisubstituted thiophene), polyselenophene, poly(3-substituted selenophene), poly(3,4-bisubstituted selenophene), poly(bisthiophene), poly(terthiophene), poly(bisselenophene), poly(terselenophene), polythieno[2,3-b]thiophene, polythieno[3,2-b]thiophene, polybenzothiophene, polybenzo[1,2-b:4,5-b']dithiophene, polyisothianaphthene, poly(monosubstituted pyrrole), poly(3,4-bisubstituted pyrrole), poly-1,3,4-oxadiazoles, polyisothianaphthene, derivatives and co-polymers thereof may be mentioned. Preferred examples of p-type OSCs are copolymers of polyfluorenes and polythiophenes, each of which may be substituted, and polymers comprising benzothiadiazole-based and thiophene-based repeating units, each of which may be substituted. In general, it is understood that the p-type organic semiconductor may also consist of a mixture of a plurality of electron donating materials.

Preferably, the p-type organic semiconductor is a polymer having a structural unit represented by the following formula (1):

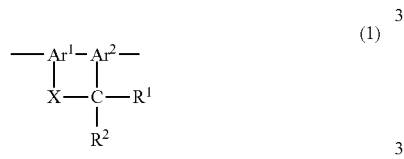

(1)

In structural formula (1), $Ar^1$ and $Ar^2$ are the same as or different from each other and represent a trivalent heterocyclic group; X represents —O—, —S—, —C(=O)—, —S(=O)—, —SO$_2$—, —Si($R^3$)($R^4$)—, —N($R^5$)—, —B($R^6$)—, —P($R^7$)—, or —P(=O)($R^8$)—; wherein $R^3$, $R^4$, $R^5$, $R^6$, $R^7$, and $R^{>8}$ are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group; $R^1$ represents a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group; $R^2$ represents an alkyl group having 6 or more carbon atoms, an alkyloxy group having 6 or more carbon atoms, an alkylthio group having 6 or more carbon atoms, an aryl group having 6 or more carbon atoms, an aryloxy group having 6 or more carbon atoms, an arylthio group having 6 or more carbon atoms, an arylalkyl group having 7 or more carbon atoms, an arylalkyloxy group having 7 or more carbon atoms, an arylalkylthio group having 7 or more carbon atoms, an acyl group having 6 or more carbon atoms, or an acyloxy group having 6 or more carbon atoms; and X and $Ar^2$ are bonded with atoms adjacent to each other on the heterocycle that constitutes $Ar^1$, and $C(R=)(R^2)$ and $Ar^1$ are bonded with atoms adjacent to each other on the heterocycle that constitutes $Ar^2$. Specific exemplary compounds and methods of their synthesis are disclosed in US 2012/0205596 A1, for example.

In a further preferred embodiment from the viewpoint of favourable absorption characteristics at blue (430 to 500 nm), cyan (500 to 520 nm) and green wavelengths (520 nm to 560 nm), the p-type organic semiconductor is a conjugated organic polymer formed from monomers comprising one or more units according to structural formulae (2) and/or (3):

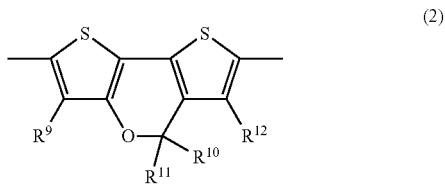

(2)

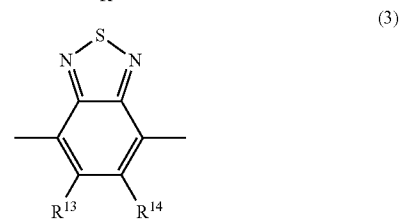

(3)

Herein, $R^9$ and $R^{12}$ are independently selected from hydrogen, a halogen, $C_1$-$C_{20}$ hydrocarbyl, particularly $C_1$-$C_{20}$ alkyl, $C_1$-$C_{20}$ hydrocarbyl containing one or more S, N, O, P or Si atoms; $R^3$ and $R^4$ are independently selected from hydrogen, $C_1$-$C_{30}$ hydrocarbyl, particularly $C_1$-$C_{30}$ alkyl, $C_1$-$C_{30}$ hydrocarbyl containing one or more S, N, O, P or Si atoms; and $R^{13}$ and $R^{14}$ are independently selected from hydrogen, a halogen, particularly fluorine, $C_1$-$C_{20}$ hydrocarbyl, particularly $C_1$-$C_{20}$ alkyl, $C_1$-$C_{20}$ hydrocarbyl containing one or more S, N, O, P or Si atoms. In a still preferred embodiment, $R^9$ and $R^{12}$ represent hydrogen, $R^{10}$ and $R^{11}$ are independently selected from a $C_1$-$C_{30}$ alkyl group, and/or $R^{13}$ and $R^{14}$ represent fluorine.

The thickness of the active layer may be suitably adjusted by the skilled artisan and is typically in the range of from 50 to 500 nm, preferably from 100 to 350 nm.

The transparent conductive oxide layer may be made of materials including e.g. indium tin oxide (ITO), gallium tin oxide, zinc indium tin oxide, indium tin oxide (ITO) being preferred.

The sum of thicknesses of the active layer and the transparent conductive oxide layer is typically in the range of from 60 to 450 nm. In the prior art, specific organic photodetector devices are known, which allow tuning of the spectral photoresponse by varying the thickness of the active layer (see e.g. R. Koeppe et al., Applied Physics Letters 2003, 82(16), 2601-2603; J. M. Lupton et al, Advanced Materials 2003, 15(17), 1471-1474). With the configuration of the organic photodetector of the present invention, it has been surprisingly shown that the resonance wavelength may be tailored by varying the thickness of the transparent conductive oxide layer. Accordingly, the present invention enables optimizing the thickness of the active layer in terms of optical properties and a favourable EQE photoresponse, and subsequently fine-tuning the conductive oxide layer thickness in order to shift the device sensitivity to the desired wavelength. While not being limited thereto, typical transparent conductive oxide layer thicknesses may be in the range of from 10 to 150 nm, in embodiments in the range of from 20 to 100 nm.

In a preferred embodiment, the semi-transparent electrode is an anode, more preferably a top anode, wherein "top" denotes a position remote from a substrate structure (if present) and close to the surface at which incoming radiation enters the detector. The semi-transparent electrode may be made of a layer of metal(s) (such as Au, Ag, Al, In etc.), for example, with Ag being preferred, wherein the layer thickness is typically in the range of from 5 to 100 nm, and wherein the optical transmittance is usually between 80% and 1%.

The reflective electrode is configured to reflect at least a portion of light and to induce optical resonance together with the semi-transparent electrode, and may also transmit a portion of light to be itself semi-transparent. As suitable material for the preparation of the reflective electrode, thin layers of metals or metal alloys may be mentioned. For higher efficiency, it is preferable that the reflective electrode is formed of silver (Ag), silver alloys (including Ag—Cu—Au (ACA) or Ag—Pd—Cu (APC)), or aluminum (Al). It is to be understood that the reflective electrode may be configured so as to comprise a plurality of layers as long as one surface thereof is reflective so as to form the optical cavity.

Other layers may be present in the organic photodetector according to the present invention, such as hole-transporting layers (HTL), electron blocking layers (EBL), electron transporting layers (ETL), spacer layers, connecting layers and hole-blocking layers (HBL), for example, the materials and thicknesses of which may be appropriately selected by the skilled artisan. For example, a hole transport layer (HTL) or an electron blocking layer (EBL) may include poly(3,4-ethylenedioxythiophene): poly(styrenesulfonate) (PEDOT: PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]phenyl (α-NPD), m-MTDATA, 4,4',4''-tris(N-carbazolyl)-triphenylamine (TCTA), and a combination thereof, without being limited thereto. The electron blocking layer (EBL) may further be an electron blocking layer in accordance with WO 2007/017475 A1, for example, in order to reduce dark current. An electron transport layer (ETL) or a hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, for example.

While not being essential, the organic photodetector according to the present invention may include an optical spacer layer. The materials and thicknesses of such layers may be suitably selected by the skilled artisan. For instance, suitable materials include, but are not limited to, TiOx, bathocuproine (BCP), $C_{60}$, or molybdenum oxide ($MoO_3$), molybdenum oxide being preferred.

The organic photodetector according to the present invention may further comprise a substrate layer may be produced from a glass, from a flexible plastic or metal film or any other conventional material, and while not being limited thereto, its thickness is typically in a range of 100 nm to 5 mm.

Also, the organic photodetector (OPD) according to the present invention may comprise a protective layer which may be made of conventional inorganic or organic materials known in the art used to prevent physical and/or chemical damage (by moisture or oxygen, for example).

In a preferred embodiment of the present invention, the organic photodetector has a configuration, wherein the transparent conductive layer is provided over the reflective electrode (at the entire surface or a part thereof), the active layer is provided over the transparent conductive layer (optionally in contact with the reflective electrode), and the semi-transparent electrode is provided over the active layer (preferably with a hole transport layer in between).

An exemplary configuration of an organic photodetector according to the present invention is shown in FIG. 1. Herein, a reflective cathode 2 is provided in contact with a substrate layer 1. A bilayer stack consisting of a transparent conductive layer 3 and an hole blocking layer 4 is deposited on the reflective cathode 2, with the transparent conductive layer 3 being in contact with the latter. The active layer 5 comprising a blend of the n-type and p-type organic semiconductor is deposited onto the bilayer stack. A hole transport layer 6 is provided between and in contact with the active layer 5 and a semi-transparent anode 7. Finally, a protective layer 8 is provided on top of the semi-transparent anode 7. While such a configuration has been shown to exhibit particularly favourable photoresponse characteristics, it is understood that the present invention is not limited to said configuration. For example, the presence of the hole transport layer, the substrate layer and the hole blocking layer is merely optional.

It will be appreciated that the preferred features of the organic photodetector (OPD) as specified above may be combined in any combination, except for combinations where at least some of the features are mutually exclusive.

The organic photodetector (OPD) described above exhibits a favourable photoresponse which enables effective and efficient color discrimination since particularly narrow FWHM and high EQE values may be simultaneously attained, so that wavelength sensitivity may be dramatically improved without the use of optical filters. Accordingly, in a preferred embodiment, the OPD according to the present invention does not comprise an optical filter, such as e.g. a notch filter.

As has been mentioned above, it has been surprisingly found that the resonance wavelength of the microcavity may not only be altered by varying the active layer thickness but also by the variation of the total thickness of the transparent conductive oxide layer and the active layer comprising the blend of an n-type organic semiconductor and a p-type organic semiconductor. Thus, it is possible to set the active layer thickness to an optimized value in terms of EQE efficiency, processability etc., and to then tune the microcavity resonance wavelength by adjusting the conductive oxide layer thickness without substantially affecting the OPD performance. Beside of improvements in terms of effectivity and efficiency of the color discrimination (without the use of optical filters), it is noted that the present invention may also be advantageous in cases where low amounts of the active layer material are available or where processing of particularly thin or thick active layer films is difficult.

Accordingly, in a further embodiment, the present invention relates to a method of tuning the resonance of a microcavity formed in an organic photodetector (OPD) to a predetermined wavelength, the organic photodetector (OPD) comprising a microcavity between a first semi-transparent electrode and a second semi-transparent electrode which is reflective, and the microcavity comprising a transparent conductive oxide layer and an active layer comprising a blend of an n-type organic semiconductor and a p-type organic semiconductor; wherein the method comprises a step of adjusting the thickness of the transparent conductive oxide layer in order to shift the resonance wavelength of the microcavity to the predetermined wavelength. Before the step of adjusting the transparent conductive oxide layer thickness, said method preferably further comprises a step of adjusting the transmittance T of the active layer at the wavelength $\lambda_{max}$ to a value of at least 50%, preferably at least 60%, more preferably at least 70%, for example at least 80%, which may be accomplished by selecting a material blend having an appropriate extinction coefficient and/or by varying the active layer thickness, for example. It is understood that the photodetector used in this method and its constituents may exhibit the properties set out in the above description of the organic photodetector (OPD).

In another embodiment, the present invention relates to a method of manufacturing of an organic photodetector (OPD) according to the above description, the method comprising: providing a transparent conductive oxide layer and an active layer between a first semi-transparent electrode which is reflective and a second semi-transparent electrode which define a microcavity, wherein the active layer comprises a blend of an n-type organic semiconductor and a p-type organic semiconductor; and wherein the n-type organic semiconductor and the p-type organic semiconductor are selected so that the active layer comprising the blend of the n-type organic semiconductor and the p-type organic semiconductor exhibits a transmittance T of at least 50%, at the wavelength $\lambda_{max}$, $\lambda_{max}$ being the wavelength of the maximum of the external quantum efficiency (EQE) spectrum of the organic photodetector (OPD) at a desired range measured according to ASTM E1021.

By using a blend of an n-type organic semiconductor and a p-type organic semiconductor in the active layer, it is ensured that the manufacturing method is simple.

The method of designing of the organic photodetector (OPD) may further comprise a step of adjusting the thickness of the transparent conductive oxide layer in order to tune the resonance wavelength of the microcavity to the desired value.

The layers constituting the organic photodetector may be fabricated by deposition techniques according to conventional methods known in the art, including photolithographic methods, sputtering techniques, thermal deposition, vacuum deposition, laser deposition, screen printing, printing, imprinting, spin casting, dipping, ink-jetting, roll coating, flow coating, drop casting, spray coating, and/or roll printing, for example.

EXAMPLES

Exemplary organic photodetectors having an inverted structure in accordance with the configuration of FIG. 1 have been manufactured, using Ag as material for the semi-transparent top anode and the reflective electrode, and as the material for the active layer a blend of $C_{60}PCBM$ as the n-type organic semiconductor and a p-type organic semiconductor according to structural formula (A)

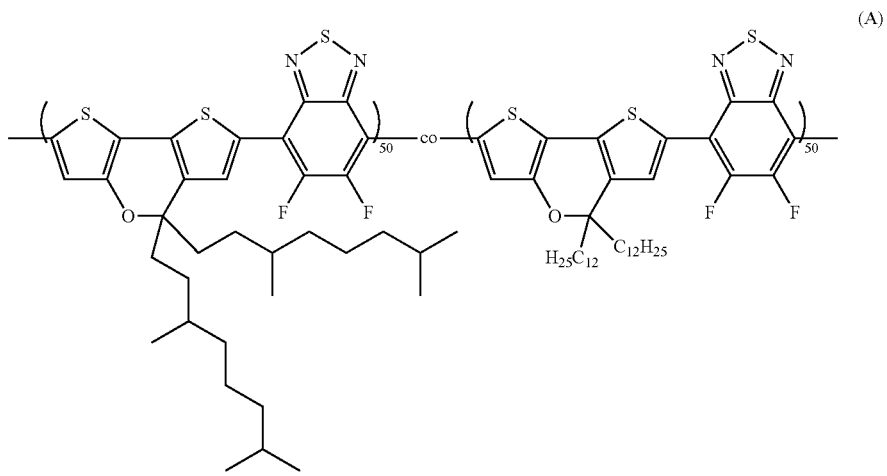

(A)

Both $C_{60}PCBM$ and compound (A) are characterized by a low absorbance around the target wavelength 550 nm (green) and exhibit absorption maxima at about 430 nm ($C_{60}PCBM$ and Compound (A)), 720 nm (Compound (A)) and 800 nm (Compound (A)). It is ensured that the transmittance T of the active layer comprising the blend of $C_{60}PCBM$ and compound (A) at 550 nm ($\lambda_{max}$) is at least 50% at the thicknesses given in the examples below.

Example 1

As the transparent conductive oxide layer, an ITO layer having a thickness of 45 nm was deposited onto the reflective Ag cathode, whereas the active layer thickness was 160 nm, which results in a total thickness of active and conductive oxide layers of 205 nm.

Example 2

An organic photodetector was prepared in accordance with Example 1, with the exception that the ITO layer had a thickness of 25 and the active layer thickness was 180 nm.

Example 3

A further organic photodetector was prepared in accordance with Example 1, with the exception that the ITO layer had a thickness of 80 nm and the active layer thickness was 140 nm, resulting in a total thickness of active and conductive oxide layers of 220 nm.

The external quantum efficiency of each of the exemplary organic photodetectors was measured in a wavelength range of about 400 to 700 nm using a calibrated IPCE measurement system. The FWHM is calculated as width of a wavelength corresponding to a half of maximum EQE using a Gaussian fitting curve of the central EQE peak.

Figure 2:
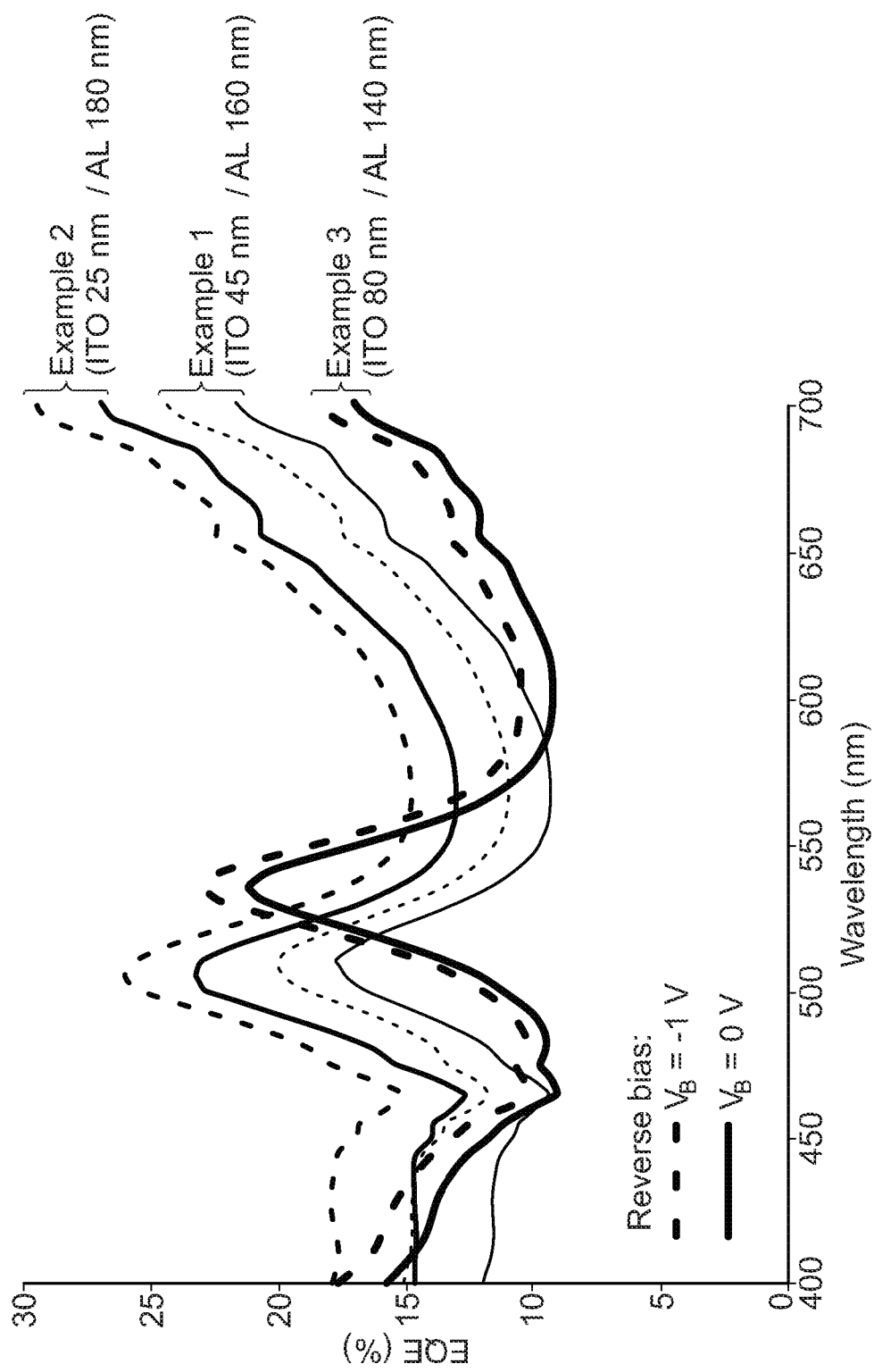
FIG. 2 shows the external quantum efficiency (EQE) spectra at different conductive oxide layer and active layer thicknesses.

The external quantum efficiency (EQE) spectrum of the organic photodetectors of Examples 1 to 3 is shown in FIG. 2, wherein the dashed curves denote the EQE response at a reverse bias voltage $V_B$ of −1 V, and the solid curves denote the EQE response at $V_B$=0V.

FIG. 2 demonstrates that the organic photodetector of Example 1 exhibits an EQE peak centered around 510 nm with a remarkably narrow FWHM of about 40 nm and an external quantum efficiency of about 26% at $V_B$=−1 V and about 23% at $V_B$=0 V.

The EQE spectrum of the organic photodetector of Example 2 likewise exhibits an peak centered around 510 nm with a FWHM of about 40 nm, with a comparatively lower external quantum efficiency (about 20% at $V_B$=−1 V and about 18% at $V_B$=0 V). It is to be noted that the resonance wavelength does not substantially shift upon decreasing the active layer thickness to 160 nm, due to the increase in ITO thickness such that the overall thickness is constant.

On the other hand, the photoresponse of Example 3 shows that the increase of the total thickness of active layer and conductive oxide layer to 220 nm shifts the EQE maximum to a longer wavelength (ca. 535 nm), which demonstrates that the resonance wavelength may be tuned to a desired value by adjusting the conductive oxide layer thickness without changing the active layer thickness and hence without a substantial impact on the FWHM and external quantum efficiency (FWHM of about 40 nm, EQE about 23% at $V_B$=−1 V and about 21% at $V_B$=0 V).

Thus, it has been shown that organic photodetectors which simultaneously exhibit excellent external quantum efficiency and a favourably low FWHM may be provided.

Once given the above disclosure, many other features, modifications, and improvements will become apparent to the skilled artisan.

REFERENCE NUMERALS

1: substrate layer
2: reflective electrode (cathode)
3: transparent conductive oxide layer
4: optical spacer layer
5: active layer
6: hole injection layer
6: semi-transparent electrode (anode)
8: protective layer

The invention claimed is:
1. An organic photodetector (OPD) comprising:
a microcavity defined by a reflective electrode and a semi-transparent electrode,
wherein the microcavity comprises a transparent conductive oxide layer and an active layer comprising an n-type organic semiconductor and a p-type organic semiconductor; and
wherein the transmittance T of the active layer at a wavelength max is at least 50%, $\lambda_{max}$ being the wavelength of the maximum of the external quantum efficiency (EQE) spectrum of the organic photodetector (OPD) at a desired range measured according to ASTM E1021.

2. The organic photodetector (OPD) according to claim 1, wherein the transmittance T of the active layer at a wavelength $\lambda_{max}$ is at least 60%.

3. The organic photodetector (OPD) according to claim 1, wherein the transparent conductive oxide layer comprises indium-tin oxide (ITO).

4. The organic photodetector (OPD) according to claim 1, wherein the n-type organic semiconductor is a fullerene derivative.

5. The organic photodetector (OPD) according to claim 1 wherein the p-type organic semiconductor is a conjugated organic polymer having repeating units comprising one or more of benzothiadiazole derivatives, fluorenyl derivatives and thiophene derivatives.

6. The organic photodetector (OPD) according to claim 1, wherein the p-type organic semiconductor is a polymer having a structural unit represented by the following formula (1):

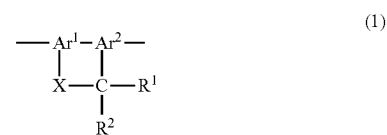

wherein:
Ar$^1$ and Ar$^2$ are the same as or different from each other and represent a trivalent heterocyclic group;
X represents —O—, —S—, —C(=O)—, —S(=O)—, —SO$_2$—, —Si(R$^3$)(R$^4$)—, —N(R$^5$)—, —B(R$^6$)—, —P(R$^7$)—, or —P(=O)(R$^8$)—; wherein R$^3$, R$^4$, R$^5$, R$^6$, R$^7$, and R$^8$ are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group;
R$^1$ represents a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group;
R$^2$ represents an alkyl group having 6 or more carbon atoms, an alkyloxy group having 6 or more carbon atoms, an alkylthio group having 6 or more carbon atoms, an aryl group having 6 or more carbon atoms, an aryloxy group having 6 or more carbon atoms, an arylthio group having 6 or more carbon atoms, an arylalkyl group having 7 or more carbon atoms, an arylalkyloxy group having 7 or more carbon atoms, an arylalkylthio group having 7 or more carbon atoms, an acyl group having 6 or more carbon atoms, or an acyloxy group having 6 or more carbon atoms; and X and $Ar^2$ are bonded with atoms adjacent to each other on the heterocycle that constitutes $Ar^1$, and $C(R^1)(R^2)$ and $Ar^1$ are bonded with atoms adjacent to each other on the heterocycle that constitutes $Ar^2$.

7. The organic photodetector (OPD) according to claim 1, wherein the p-type organic semiconductor is a conjugated organic polymer formed from monomers comprising one or more units according to structural formulae (2) and/or (3):

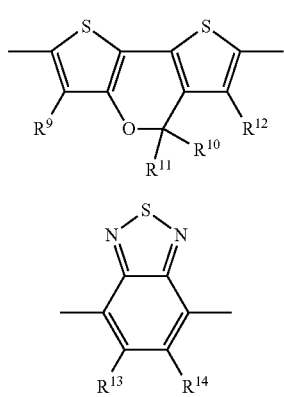

wherein $R^1$ and $R^4$ are independently selected from hydrogen, a halogen, $C_1$-$C_{20}$ hydrocarbyl, particularly $C_1$-$C_{20}$ alkyl, and $C_1$-$C_{20}$ hydrocarbyl containing one or more S, N, O, P or Si atoms;

$R^2$ and $R^3$ are independently selected from hydrogen, $C_1$-$C_{30}$ hydrocarbyl, particularly $C_1$-$C_{30}$ alkyl, and $C_1$-$C_{30}$ hydrocarbyl containing one or more S, N, O, P or Si atoms; and $R^5$ and $R^6$ are independently selected from hydrogen, a halogen, particularly fluorine, $C_1$-$C_{20}$ hydrocarbyl, particularly $C_1$-$C_{20}$ alkyl, and $C_1$-$C_{20}$ hydrocarbyl containing one or more S, N, O, P or Si atoms.

8. The organic photodetector (OPD) according to claim 1, wherein the sum of thicknesses of the active layer and the transparent conductive oxide layer is in the range of from 60 to 450 nm.

9. The organic photodetector (OPD) according to claim 1, wherein the thickness of the transparent conductive oxide layer is in the range of from 10 to 150 nm.

10. The organic photodetector (OPD) according to claim 1, further comprising a substrate layer,
wherein the reflective electrode is a reflective cathode and is provided in contact with the substrate layer, and
the semi-transparent electrode is an anode.

11. The organic photodetector (OPD) according to claim 10, further comprising a hole transport layer between the active layer and the semi-transparent electrode.

12. The organic photodetector (OPD) according to claim 1, wherein the full width at half maximum (FWHM) of the external quantum efficiency spectrum of the organic photodetector is less than 50 nm.

13. Method of tuning the resonance of a microcavity formed in an organic photodetector (OPD) according to claim 1 to a predetermined wavelength,
the method comprising a step of adjusting the thickness of the transparent conductive oxide layer in order to shift the resonance wavelength of the microcavity to the predetermined wavelength.

14. The organic photodetector (OPD) according to claim 1, wherein the transmittance T of the active layer at a wavelength $\lambda_{max}$ is at least 70%.

15. The organic photodetector (OPD) according to claim 1, wherein the transmittance T of the active layer at a wavelength $\lambda_{max}$ is at least 80%.

16. The organic photodetector (OPD) according to claim 1, wherein the n-type organic semiconductor is a C60 fullerene derivative.

17. Method of manufacturing an organic photodetector (OPD) comprising:
providing a transparent conductive oxide layer and an active layer between a first semi-transparent electrode which is reflective and a second semi-transparent electrode which define a microcavity,
wherein the active layer comprises a blend of an n-type organic semiconductor and a p-type organic semiconductor; and
wherein the n-type organic semiconductor and the p-type organic semiconductor are selected so that the transmittance T of the active layer at a wavelength $\lambda_{max}$ is at least 50%, $\lambda_{max}$ being the wavelength of the maximum of the external quantum efficiency (EQE) spectrum of the organic photodetector (OPD) at a desired range measured according to ASTM E1021.

18. Method of designing an organic photodetector (OPD) according to claim 17, further comprising a step of adjusting the thickness of the transparent conductive oxide layer in order to tune the resonance wavelength of the microcavity.

* * * * *